(12) United States Patent
Watanabe et al.

(10) Patent No.: US 12,021,322 B2
(45) Date of Patent: Jun. 25, 2024

(54) ELECTRICAL CONNECTION SHEET AND TERMINAL-EQUIPPED GLASS PLATE STRUCTURE

(71) Applicant: SEKISUI POLYMATECH CO., LTD., Saitama (JP)

(72) Inventors: Yasuyoshi Watanabe, San Jose, CA (US); Hideaki Konno, Koshigaya (JP); Tsubasa Kamiya, Saitama (JP)

(73) Assignee: SEKISUI POLYMATECH CO., LTD., Saitama (JP)

( * ) Notice: Subject to any disclaimer, the term of this patent is extended or adjusted under 35 U.S.C. 154(b) by 561 days.

(21) Appl. No.: 17/282,501

(22) PCT Filed: Oct. 10, 2019

(86) PCT No.: PCT/JP2019/040036
§ 371 (c)(1),
(2) Date: Apr. 2, 2021

(87) PCT Pub. No.: WO2020/075810
PCT Pub. Date: Apr. 16, 2020

(65) Prior Publication Data
US 2021/0359434 A1 Nov. 18, 2021

(30) Foreign Application Priority Data

Oct. 11, 2018 (JP) .................................. 2018-192750

(51) Int. Cl.
*H01R 11/01* (2006.01)
*B32B 3/18* (2006.01)
(Continued)

(52) U.S. Cl.
CPC ................ *H01R 11/01* (2013.01); *B32B 3/18* (2013.01); *B32B 7/14* (2013.01); *B32B 17/06* (2013.01);
(Continued)

(58) Field of Classification Search
None
See application file for complete search history.

(56) References Cited

U.S. PATENT DOCUMENTS 5,597,982 A * 1/1997 Hiwada .................. H05K 3/326
361/767
11,634,842 B2 * 4/2023 Kimoto .................... H01B 7/06
174/254

(Continued)

FOREIGN PATENT DOCUMENTS

CN 100397711 C * 6/2008 ............. H01R 11/01
EP 1365479 A1 * 11/2003 ......... H01R 13/2414
(Continued)

OTHER PUBLICATIONS

JP2005166534_English_translation (Year: 2005).*
International Search Report (ISR) dated Nov. 26, 2019 in International (PCT) Application No. PCT/JP2019/040036.

*Primary Examiner* — Timothy J. Dole
*Assistant Examiner* — Muhammed Azam
(74) *Attorney, Agent, or Firm* — WENDEROTH, LIND & PONACK, L.L.P.

(57) ABSTRACT

An electrical connection sheet includes a conduction part including a conductive rubbery elastomer, an adhesion member, and a sheet-shaped connection member fitted with the conduction part and the adhesion member. Both surfaces of the electrical connection sheet are adhesible.

14 Claims, 13 Drawing Sheets

(51) Int. Cl.
  *B32B 7/14*  (2006.01)
  *B32B 17/06*  (2006.01)
  *H05B 3/84*  (2006.01)

(52) U.S. Cl.
  CPC .......... *H05B 3/84* (2013.01); *B32B 2307/202* (2013.01); *B32B 2315/08* (2013.01); *B32B 2605/08* (2013.01); *H05B 2203/016* (2013.01)

(56) References Cited

U.S. PATENT DOCUMENTS

| | | | | |
|---|---|---|---|---|
| 11,855,368 | B2 * | 12/2023 | Watanabe | H01R 12/7041 |
| 11,881,643 | B2 * | 1/2024 | Konno | C08K 9/02 |
| 2001/0049208 | A1 * | 12/2001 | Igarashi | H01R 43/007 |
| | | | | 439/68 |
| 2002/0046873 | A1 * | 4/2002 | Chung | H01R 12/52 |
| | | | | 257/E23.07 |
| 2004/0101666 | A1 * | 5/2004 | Tsubosaki | G01R 1/0735 |
| | | | | 428/209 |
| 2005/0258850 | A1 * | 11/2005 | Yamada | H01R 11/01 |
| | | | | 324/755.08 |
| 2006/0148285 | A1 * | 7/2006 | Naoi | G01R 1/0735 |
| | | | | 439/86 |
| 2006/0177971 | A1 * | 8/2006 | Kokubo | H01L 21/486 |
| | | | | 438/119 |
| 2007/0040245 | A1 * | 2/2007 | Seno | H01R 43/007 |
| | | | | 257/666 |
| 2007/0249161 | A1 * | 10/2007 | Nakaone | H01R 12/52 |
| | | | | 257/734 |
| 2009/0039905 | A1 * | 2/2009 | Kimura | G01R 3/00 |
| | | | | 29/829 |
| 2009/0053907 | A1 * | 2/2009 | Konno | H01R 13/2414 |
| | | | | 439/38 |
| 2010/0127724 | A1 * | 5/2010 | Naoi | G01R 1/0491 |
| | | | | 439/86 |
| 2010/0193242 | A1 | 8/2010 | Derda et al. | |
| 2012/0152593 | A1 * | 6/2012 | Nakaone | H01L 23/49827 |
| | | | | 174/250 |
| 2015/0084658 | A1 * | 3/2015 | Lee | G01R 1/0416 |
| | | | | 324/750.24 |
| 2015/0155646 | A1 | 6/2015 | Takeuchi et al. | |

FOREIGN PATENT DOCUMENTS

| | | | | | |
|---|---|---|---|---|---|
| EP | 1548884 | A1 * | 6/2005 | ....... | H01L 23/49827 |
| EP | 1596429 | A1 * | 11/2005 | ........... | G01R 1/0735 |
| EP | 1608040 | A1 * | 12/2005 | ........... | G01R 1/0735 |
| EP | 1615297 | A1 * | 1/2006 | ........... | G01R 1/0735 |
| EP | 1826878 | A2 * | 8/2007 | ......... | H01R 13/6599 |
| EP | 2028722 | A2 * | 2/2009 | ......... | H01R 13/2414 |
| JP | 11-284332 | | 10/1999 | | |
| JP | H11353948 | A * | 12/1999 | | |
| JP | 2001015190 | A * | 1/2001 | | |
| JP | 2001210402 | A * | 8/2001 | ......... | G01R 1/07307 |
| JP | 2001239526 | A * | 9/2001 | | |
| JP | 2001246626 | A * | 9/2001 | | |
| JP | 2002289277 | A * | 10/2002 | | |
| JP | 2003077962 | A * | 3/2003 | ............... | H01B 1/22 |
| JP | 2004095547 | A * | 3/2004 | ......... | G01R 1/07314 |
| JP | 2004111930 | A * | 4/2004 | ......... | G01R 1/06711 |
| JP | 2004271520 | A * | 9/2004 | ........... | G01R 1/0735 |
| JP | 2004309465 | A * | 11/2004 | ........... | G01R 1/0735 |
| JP | 2004335450 | A * | 11/2004 | ........... | G01R 1/0735 |
| JP | 2005-166534 | | 6/2005 | | |
| JP | 2005317944 | A * | 11/2005 | ......... | G01R 1/07314 |
| JP | 3726839 | B2 | 12/2005 | | |
| JP | 2006196475 | A * | 7/2006 | | |
| JP | 3928607 | B2 | 6/2007 | ....... | H01L 23/49827 |
| JP | 3938117 | B2 * | 6/2007 | ......... | G01R 1/06755 |
| JP | 2007-227111 | | 9/2007 | | |
| JP | WO2007116826 | A1 * | 10/2007 | | |
| JP | 2007-294161 | | 11/2007 | | |
| JP | 2008101931 | A * | 5/2008 | | |
| JP | 4099905 | B2 | 6/2008 | | |
| JP | 2009115579 | A * | 5/2009 | | |
| JP | 4423991 | B2 * | 3/2010 | ........... | G01R 1/0735 |
| JP | 2012174417 | A * | 9/2012 | | |
| JP | 5104265 | B2 * | 12/2012 | | |
| JP | 2013195331 | A * | 9/2013 | | |
| JP | 6070707 | | 2/2017 | | |
| JP | 2019036394 | A * | 3/2019 | | |
| JP | 6830720 | B1 * | 2/2021 | ............. | H01R 11/01 |
| JP | 2022109625 | A * | 7/2022 | | |
| KR | 20030009785 | A * | 2/2003 | | |
| KR | 20080082652 | A * | 9/2008 | | |
| KR | 20090019729 | A * | 2/2009 | | |
| WO | WO-2004015760 | A1 * | 2/2004 | ......... | G01R 1/07314 |
| WO | WO-2004015761 | A1 * | 2/2004 | ......... | G01R 1/06755 |
| WO | WO-2004015762 | A1 * | 2/2004 | ......... | G01R 1/06711 |
| WO | WO-2004075283 | A1 * | 9/2004 | ........... | G01R 1/0735 |
| WO | WO-2004086565 | A1 * | 10/2004 | ........... | G01R 1/0735 |
| WO | WO-2004093254 | A1 * | 10/2004 | ........... | G01R 1/0735 |
| WO | WO-2004112195 | A1 * | 12/2004 | ......... | G01R 1/06755 |
| WO | WO-2005101589 | A1 * | 10/2005 | ......... | H01R 13/2414 |
| WO | WO-2006008784 | A1 * | 1/2006 | ........... | G01R 1/0735 |
| WO | WO-2006009144 | A1 * | 1/2006 | ........... | G01R 1/0735 |
| WO | WO-2006025279 | A1 * | 3/2006 | ........... | G01R 1/0735 |
| WO | WO-2006043628 | A1 * | 4/2006 | ......... | H01R 13/2414 |
| WO | WO-2006043629 | A1 * | 4/2006 | ......... | H01R 13/2414 |
| WO | WO-2008120654 | A1 * | 10/2008 | ........... | G01R 1/0491 |
| WO | WO-2009015975 | A1 * | 2/2009 | ............. | H01R 12/62 |
| WO | 2011/027692 | | 3/2011 | | |
| WO | 2014/024980 | | 2/2014 | | |
| WO | WO-2020075810 | A1 * | 4/2020 | ............. | B32B 17/06 |
| WO | WO-2020203037 | A1 * | 10/2020 | ............. | H01R 11/01 |
| WO | WO-2020218520 | A1 * | 10/2020 | ............. | H01R 11/01 |
| WO | WO-2021029307 | A1 * | 2/2021 | ............. | H01R 11/01 |
| WO | WO-2022158110 | A1 * | 7/2022 | | |

* cited by examiner

ELECTRICAL CONNECTION SHEET AND TERMINAL-EQUIPPED GLASS PLATE STRUCTURE

TECHNICAL FIELD

The present invention relates to an electrical connection sheet, and a terminal-equipped glass plate structure having the electric joint sheet.

BACKGROUND ART

In automotive window glasses, since a defroster, a defogger or the like is installed, it is needed that a power feed section composed of a conduction layer is formed on a glass plate and terminals are connected to the power feed section. For the connection of the terminals to the power feed section, solder has conventionally been used broadly. As an alternative to the solder, for example, as disclosed in JP 6070707 B, use of a conductive rubber is studied. In JP 6070707 B, terminals are adhered to a glass plate by an adhesive material composed of a thermosetting adhesive agent so that the conductive rubber is held in a compressed state.

Further as disclosed in JP 2007-227111 A, there is conventionally known a connector sheet having a sheet section having electrical insulation and conduction parts installed on the sheet section. The connector sheet is used for electrically connecting a metal part constituting a housing of an electric device with a ground connection part of a circuit board built in the housing, and fixed to the circuit board by metal screws or the like.

SUMMARY OF INVENTION

Technical Problem

When metal terminals are fixed to a power feed section of a glass plate by solder, the solder peels due to heat and deterioration and the metal terminals become liable to come off. Further as shown in JP 6070707 B, also when a conductive rubber is used, metal terminals become liable to come off due to the resilience of the rubber. Further in JP 6070707 B, since the adhesive material is a thermosetting adhesive agent in the work of adhering metal terminals to a mounting member such as a glass plate, heating and time are required until being cured, leading to poor workability. Further, the use of the conductive rubber poses such a problem that the electric resistance is liable to increase and when a large current is allowed to flow, the temperature rises.

On the other hand, the connector sheet shown in JP 2007-227111 A is fixed to the circuit board by screwing the metal screws to fitting holes installed on the circuit board for ground connecting the metal part of the housing with the circuit board. That is, although the connector sheet shown in JP 2007-227111 A is effective to a member which can be installed with fitting holes to which metal screws are screwable, it is difficult to say that the connector sheet is effective to a glass plate, a metal terminal and the like in which installation of fitting holes to which metal screws are screwable is difficult. Therefore, it is difficult to use the connector sheet shown in JP 2007-227111 A and electrically connect a metal terminal to a power feed section through compressed conduction parts while the metal terminal is fixed to a mounting member such as a glass plate.

Then, the present invention aims to provide an electrical connection sheet which can easily fix a metal terminal to a power feed section of a mounting member such as a glass plate so as to electrically connect both through a compressed conduction part. The present invention also aims to provide an electrical connection sheet which makes it difficult for a terminal to peel from a mounting member such as a glass plate equipped with the terminal, connects the terminal to a contact member installed on the mounting member in a low electric resistance, and hardly increases in temperature even when a large current is made to flow.

Solution to Problem

As a result of exhaustive studies, the present inventors have found that the above problem can be solved by making each member in an electrical connection sheet having a conduction part, an adhesion member and a connection member to have a predetermined constitution, and this finding has led to the completion of the present invention. The present invention provides the following [1] to [17].

[1] An electrical connection sheet comprising a conduction part comprising a conductive rubbery elastomer, an adhesion member, and a sheet-shape connection member fitted with the conduction part and the adhesion member,
   the connection member being fitted with the adhesion member so that both surfaces of the electrical connection sheet are adhesible.

[2] The electrical connection sheet according to [1], wherein there are a plurality of the conduction parts; the each of the conduction parts comprises a conductive rubbery elastomer; and the connection member is fitted with the plurality of conduction parts.

[3] The electrical connection sheet according to the above [1] or [2], wherein the adhesion member is disposed on the outside of the conduction parts.

[4] The electrical connection sheet according to any one of the above [1] to [3], wherein the conduction part is disposed in a through-hole installed in the connection member.

[5] The electrical connection sheet according to any one of the above [1] to [4], wherein the adhesion member comprises a first adhesion layer and a second adhesion layer installed on the respective surfaces of the connection member.

[6] The electrical connection sheet according to the above [5], wherein the first adhesion layer and the second adhesion layer are each selected from the group consisting of a pressure-sensitive adhesive agent layer and a double sided pressure-sensitive adhesive tape.

[7] The electrical connection sheet according to any one of the above [1] to [4], wherein the adhesion member is an adhesion layer installed on one surface of the connection member; and the adhesion layer is disposed so as to protrude from the connection member.

[8] The electrical connection sheet according to the above [7], wherein the adhesion layer is a double sided pressure-sensitive adhesive tape.

[9] The electrical connection sheet according to any one of the above [1] to [8], wherein the conductive rubbery elastomer comprises conductive particles.

[10] The electrical connection sheet according to the above [9], wherein the conductive particles are continuous in the thickness direction.

[11] The electrical connection sheet according to any one of the above [1] to [10], wherein the conduction part has a diameter D1 of 1.0 mm or larger and 1.5 mm or smaller.

[12] The electrical connection sheet according to any one of the above [1] to [11], wherein the conduction part has an electric resistance when compressed by 20% of 100 mΩ or lower.

[13] The electrical connection sheet according to any one of the above [2] to [12], wherein in the plurality of the conduction parts, the interval L between neighboring conduction parts is 0.5 mm or larger and 200 mm or smaller.

[14] The electrical connection sheet according to any one of the above [1] to [13], wherein the interval between the adhesion member and the conduction part is 0.1 mm or larger and 10.0 mm or smaller.

[15] A terminal-equipped glass plate structure, comprising an electrical connection sheet according to any one of the above [1] to [14], a glass plate provided with a conduction layer on at least one surface thereof, and a terminal,
the electrical connection sheet being disposed between the terminal and the conduction layer; and the terminal being connected to the conduction layer through the conduction part; and
the terminal being fixed to the glass plate by the adhesion member.

[16] The terminal-equipped glass plate structure according to the above [15], wherein the conduction part is compressed.

[17] The terminal-equipped glass plate structure according to [15] or [16], wherein there are a plurality of the conduction parts.

Advantageous Effects of Invention

According to the electrical connection sheet of the present invention, a metal terminal can easily be fixed to a power feed section of a mounting member such as a glass plate so as to electrically connect both through a compressed conduction part. Further according to the electrical connection sheet of the present invention, it makes difficult for a terminal to peel from a mounting member such as a glass plate, connects the terminal to a contact member installed on the mounting member in a low electric resistance, and hardly increases in temperature when a large current is made to flow.

BRIEF DESCRIPTION OF DRAWINGS

FIG. 16 is a graph showing evaluation results in Examples.

FIG. 17 is a graph showing evaluation results in Examples.

DESCRIPTION OF EMBODIMENTS

Hereinafter, the present invention will be described by way of embodiments.

First Embodiment

Figure 1:
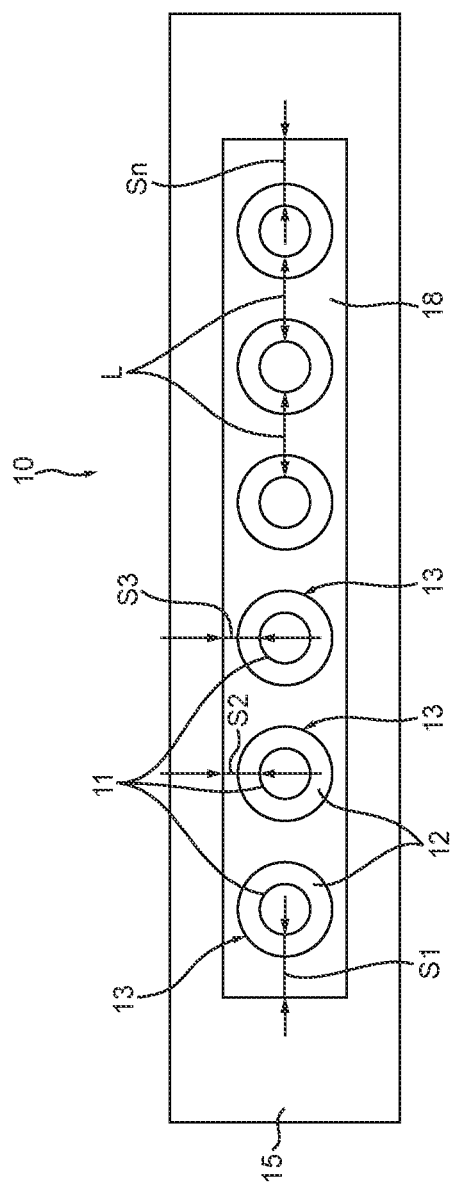
FIG. 1 is a plan view of an electrical connection sheet according to a first embodiment.
Figure 2:
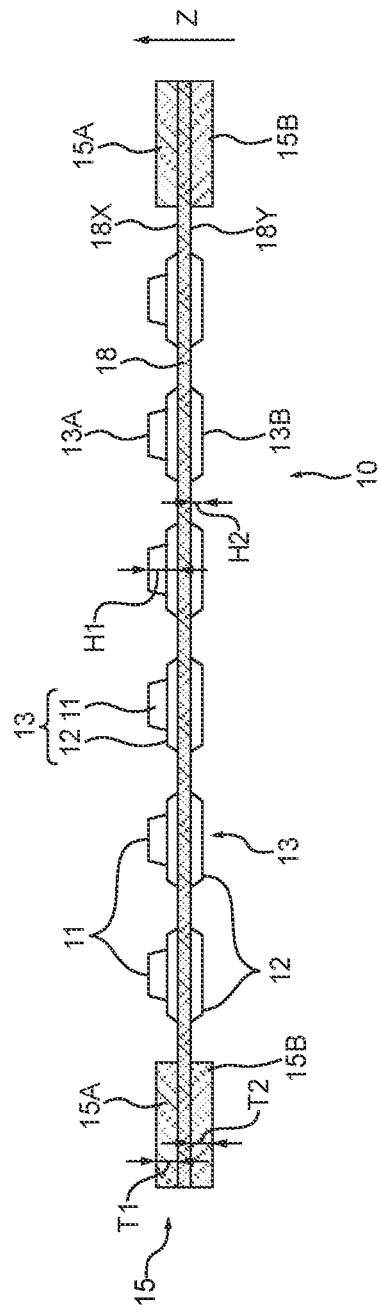
FIG. 2 is a cross-sectional view of an electrical connection sheet according to the first embodiment.

FIGS. 1 and 2 show an electrical connection sheet 10 according to a first embodiment of the present invention. The electrical connection sheet 10 has conduction parts 11, an adhesion member 15, and a sheet-shape connection member 18 fitted with the conduction parts 11 and the adhesion member 15.

(Connection Member)

As shown in FIGS. 1 and 2, the connection member 18 is a planar sheet-shape member and is composed of, for example, a resin sheet. The resin sheet is not especially limited as long as having a certain strength capable of support the conduction parts 11 and the adhesion member 15. The resin sheet to be used may be a resin sheet having flexibility. As the resin sheet, there can be used, for example, polyethylene terephthalate (PET) sheet, polyethylene naphthalate sheet, polycarbonate sheet, polyetheretherketone sheet, polyimide sheet, polyamide sheet, polyethylene sheet, polypropylene sheet, polyurethane sheet, or the like. Among these, from the viewpoint of improvement in the positional accuracy from the periphery of the electrical connection sheet 10 to the conduction parts 11, and from the viewpoint of durability and heat resistance, a PET sheet and a polyimide sheet are preferable; further from the viewpoint of improvement in the positional accuracy of each of the conduction parts 11, a polyimide sheet is preferable. As the connection member 18, other than the resin sheet, for example, a metal sheet or a paper can be used.

The thickness of the connection member 18 (resin sheet) is not especially limited, but is, for example, 30 to 500 μm and preferably 50 to 350 μm. With the thickness in the above range, the connection member 18 can support and position the conduction parts and the adhesion member, and the handling of the connection member and fitting thereof to predetermined positions are made easy, so the case is preferable.

(Conduction Part)

In the electrical connection sheet 10, a plurality of the conduction parts 11 are installed. With a plurality of the conduction part 11 installed, since a terminal described later is electrically connected to contact members of a conduction layer or the like through the plurality of the conduction parts 11, even when a large current is made to flow a large current between the terminal and the contact members, the electric resistance of each of the conduction parts 11 is suppressed low, thereby suppressing the temperature rise in the conduction parts 11. Therefore, the adhesion member 15 prevents the terminal adhered to a mounting member (a glass plate or the like described later) provided with the contact members from peeling from the mounting member due to heating, deterioration and the like of the electrical connection sheet 10.

Further by installing a plurality of small conduction parts 11 rather than installing a conduction part 11 having a large area singly, since the load when all of the plurality of conduction parts 11 are compressed becomes low, the terminal is prevented also from peeling due to the resilience of the conduction parts 11.

Figure 3:
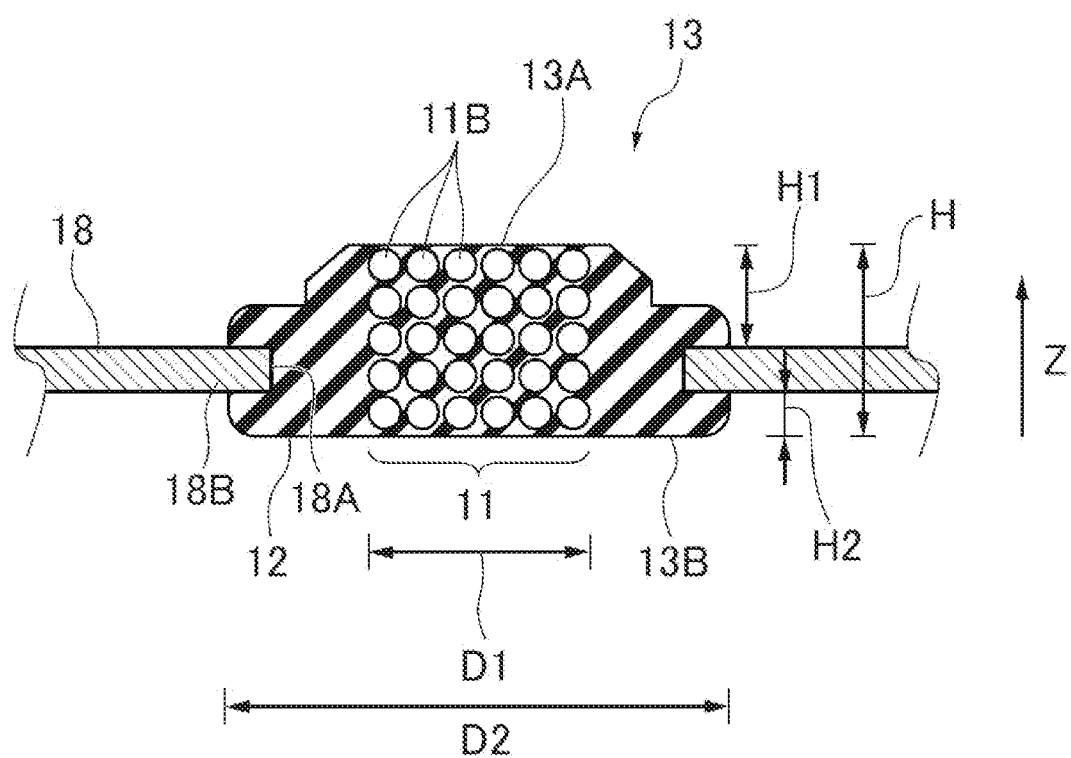
FIG. 3 is a cross-sectional view of a connector having a conduction part.

The conduction part 11 is constituted of a conductive rubbery elastomer. The conductive rubbery elastomer constituting the conduction part 11 is more specifically, as shown in FIG. 3, the one in which a large number of conductive particles 11B are contained in a rubbery elastomer. Here, the conductive particles 11B are preferably arrayed so as to be continuous in the thickness direction Z of the electrical connection sheet 10. The conductive particles 11B, more preferably, have magnetism, and are arrayed in a chain form in the thickness direction Z by a magnetic field application. Thus arraying the particles so as to be continuous in the thickness direction Z enables the electric resistance to be low even under a low compressive load.

The conduction part 11 is usually formed into a columnar shape. The cross-section of the columnar shape is not especially limited, and may have a circular shape or may have a polygonal shape, but preferably has a circular shape. The columnar conduction part 11 is installed with a cylindrical insulation part 12 so as to surround the outer periphery of the conduction part 11, and the insulation part 12 and the conduction part 11 are unified and constitute a connector 13.

The insulation part 12 is constituted of a rubbery elastomer. That is, the connector 13 is formed integrally with the rubbery elastomer, and as shown in FIG. 3, has the conductive particles 11B arrayed so as to continuous in the thickness direction in its central portion. As shown in FIG. 3, in the connector 13 (that is, insulation part 12), the diameter may vary along the thickness direction Z. In the connector 13, for example, as shown in FIG. 3, it is preferable that the diameter of one end (top end 13A) in the thickness direction is smaller than the diameter of the middle portion, and it suffices when the diameter of the top end 13A is smaller than the diameter of the other end (base end 13B). In the connector 13, when the diameter of the top end 13A side is thus small, it becomes easy for the top end 13A side to be compressed along the thickness direction Z.

In the conduction part 11, the electric resistance when compressed by 20% is preferably 100 mΩ or lower. With the electric resistance when compressed being 100 mΩ or lower, heat generation of the conduction part 11 becomes difficult to occur even when a large current is made to flow. From such a viewpoint, the electric resistance is more preferably 20 mΩ or lower. The electric resistance is usually 0.1 mΩ or higher due to restrictions of materials and the like.

The electric resistance when compressed by 20% can be measured by passing a current generated by a constant-current power source through the conduction part 11 in the state that the conduction part 11 is compressed by 20%, measuring the voltage, and calculating the electric resistance value.

In the sheet-shape connection member 18, through-holes 18A (see FIG. 3) are formed. The shape of the through-holes 18A may be adjusted to the shape of the connector 13 or the conduction part 11, and is a circular shape or a polygonal shape such as a square shape, but is preferably a circular shape. Here, a part constituting the outer peripheral part of the through-hole 18A is called an edge part 18B.

In the through-hole 18A, the conduction part 11 is disposed. More specifically, the connector 13 constituting the conduction part 11 is disposed in the through-hole 18A so that the edge part 18B is embedded in the insulation part 12. By such a constitution, in the connector 13, the insulation part 12 is fixed to the connection member 18 and the conduction part 11 is thereby fitted to the connection member 18.

The conductive particle 11B is, as described above, preferably a magnetic conductive particle. The material of the magnetic conductive particle includes nickel, cobalt, iron, ferrites, and alloys thereof; and the shape thereof includes particulate shapes, fibrous shapes, chip shapes and fine wire shapes. The magnetic conductive particle may further be a highly conductive metal, a resin or a ceramic coated with a magnetic conductor or a magnetic conductor coated with a highly conductive metal. The highly conductive metal includes gold, silver, platinum, aluminum, copper, iron, palladium, chromium and stainless steels.

For example, in the case of a silver-coated nickel particle, when the amount of the highly conductive metal coating the magnetic conductor is in the range of 5 to 40% by mass in mass ratio of silver to nickel, the magnetism of the conductive particle becomes high and the electric resistance becomes sufficiently low, which is preferable. The kinds and amounts of a magnetic conductor and a metal contained in the conductive particle can be analyzed, for example, by ICP atomic emission spectrometry. From these viewpoints, in the case of the silver-coated nickel particle, the ratio of the mass of silver to that of nickel is preferably 7 to 35% by mass and more preferably 10 to 30% by mass.

The average particle diameter of the magnetic conductive particles is made to be preferably 1 to 200 μm in that a chain state is easily formed by a magnetic field application whereby a conductor can efficiently be formed. Here, the average particle diameter means a particle diameter at 50% in volume cumulation (D50) in a particle size distribution of conductive particles as determined by a laser diffraction scattering method.

The conductive particle may be used in one kind singly or concurrently in two or more kinds. Further as the conductive particle, not a magnetic conductive particle but other conductive particles can also be used. Examples of the other conductive particles include particles of conductive metals, carbon fibers, graphite, graphene, carbon nanotubes.

The filling factor of the conductive particles 11B in the conduction part 11 is, for example, 10 to 70% by volume and preferably 20 to 50% by volume. By making the filling factor in these ranges, the conductivity can be secured while a certain strength is imparted to the conduction part 11. Here, the filling factor means a volumetric proportion of the conductive particles 11B to the total volume of the conduction part 11.

On the other hand, the insulation part 12 usually does not contain the conductive particles 11B, and the filling factor of the conductive particles 11A in the insulation part 12 is usually 0% by volume. The insulation part, however, is allowed to contain a small amount of conductive particles 11B inevitably mingling in the production process and the like. Therefore, the filling factor of the conductive particles 11A in the insulation part 12 may be lower than 5% by volume, and is preferably lower than 1% by volume.

Examples of the rubbery elastomer constituting the conduction part 11 include thermosetting rubber and thermoplastic elastomer. The thermosetting rubber is a rubber cured by heating, and specifically includes silicone rubber, natural rubber, isoprene rubber, butadiene rubber, acrylonitrile·butadiene rubber, styrene·butadiene rubber, chloroprene rubber, nitrile rubber, butyl rubber, ethylene·propylene rubber, acrylic rubber, fluororubber and urethane rubber. Among these, preferable is silicone rubber, which is excellent in molding processability, electrical insulation, weather resistance and the like.

The hardness of the rubbery elastomer after curing constituting the conduction part 11 is, in the A-type durometer hardness according to JIS K6253, preferably A10 to A50, more preferably A15 to A45 and still more preferably A20 to A40. With the hardness of the rubbery elastomer after curing being in the above range, the terminal can be prevented from peeling due to resilience of the conduction part 11.

The thermoplastic elastomer includes styrene-based thermoplastic elastomer, olefin-based thermoplastic elastomer, ester-based thermoplastic elastomer, urethane-based thermoplastic elastomer, polyamide-based thermoplastic elastomer, vinyl chloride-based thermoplastic elastomer, fluorinated thermoplastic elastomer and ionically crosslinked thermoplastic elastomer.

The rubbery elastomer may be used in one kind of the above rubbers and elastomers singly or concurrently in two or more thereof.

Also as the rubbery elastomer constituting the insulation part 12, thermosetting rubber, thermoplastic elastomer and the like may be used, and specific examples and preferable examples thereof are as described above. Also the rubbery elastomer constituting the insulation part 12 may be used similarly singly or concurrently in two or more.

Further as described above, it is preferable that the rubbery elastomers constituting the insulation part 12 and the conduction part 11 are integrally formed. Therefore, as the rubbery elastomers constituting the insulation part 12 and the conduction part 11, it is preferable to use the same kind, and it is more preferable that either of the rubbery elastomers constituting the insulation part 12 and the conduction part 11 is a silicone rubber.

The rubbery elastomer is, from the viewpoint of making it easy for the conductive particles to be arrayed in the thickness direction by a magnetic field application or the like, preferably one made by curing a liquid rubber or a thermally meltable one. Here, the liquid rubber is a rubber which is, before being cured, a liquid at normal temperature (23° C.) at the atmospheric pressure (1 atm), and as a specific rubber, there may be used liquid rubber of the above listed thermosetting rubbers, and above all, a liquid silicone rubber is preferable. The thermally meltable rubber includes thermoplastic elastomer.

In the present invention, the diameter D1 of each of the conduction parts 11 is, for example, 0.8 mm or larger and 2.0 mm or smaller. With the diameter of the conduction part 11 being in the above range, a large current is enabled to be made to flow through the plurality of the conduction parts 11 without making the electric resistance of each of the conduction parts 11 very high. From the viewpoint of making the electric resistance to be sufficiently low and making it more difficult for the temperature to rise even when a large current is made to flow, the diameter D1 is preferably 1.0 mm or larger and 1.5 mm or smaller.

Here, the diameter D1 of the conduction part 11, in the case where the diameter varies along the thickness direction Z, may be calculated as an average value (for example, 10-point average).

The height H of the conduction part 11 is not especially limited, but is preferably 0.2 mm or higher and 2.0 mm or lower and more preferably 0.4 mm or higher and 1.0 mm or lower.

By making the height H of the conduction part 11 to be equal to or higher than these lower limits, even when the conduction part 11 is electrically connected in a sufficiently compressed state, generation of short-circuit is prevented. Further by making that to be equal to or lower than these upper limits, it becomes unnecessary for the distance between the terminal and the contact members of the conduction layer or the like to be separated more than needed.

The diameter D2 of the connector 13 (that is, insulation part 12) is not especially limited, but is, for example, 0.1 mm or larger and 5.0 mm or smaller and preferably 0.2 mm or larger and 4.0 mm or smaller. By making the diameter D2 to be equal to or higher than these lower limits, it becomes easy for the insulation between the conduction part 11 and the connection member 18 to be secured. Further by making that to be equal to or lower than the upper limits, the size of the connector 13 is prevented from becoming larger than needed. It is preferable that the insulation part 12 is installed at least so as to surround the side surface of the conduction part 11. The insulation part 12 is installed independently for each of the conduction parts 11, and besides, may be installed so as to thinly connect the plurality of conduction parts 11 on the connection member 18.

Here, the diameter of the connector 13, in the case where the diameter varies along the thickness direction Z, may be calculated as an average value (for example, 10-point average).

In the present embodiment, the plurality of the conduction parts 11, that is, the plurality of the connectors 13, as shown in FIG. 1, are disposed in a row. Neighboring connectors 13 (that is, conduction parts 11) are mutually separated.

Here, the interval L between neighboring conduction parts 11, 11 is preferably 0.5 mm or larger and 200 mm or smaller and more preferably 1 mm or larger and 50 mm or smaller. By making the interval L in these ranges, the insulation between the neighboring conduction parts 11, 11 can be secured without making the size of the electrical connection sheet 10 larger than needed. Here, the interval L means the shortest distance between each conduction part 11 and a conduction part 11 closest thereto.

(Adhesion Member)

The adhesion member 15 is a member for making both surfaces of the electrical connection sheet 10 adhesible to other members. The electrical connection sheet 10 having the adhesion member 15 enables the terminal to be securely and easily fixed to a mounting member (for example, glass plate) provided with the contact members while the terminal and the contact members of a conduction layer or the like are electrically connected. Hence, it becomes difficult for the terminal and the like to peel from the mounting member even when the conduction parts 11 are fixed in a compressed state.

The adhesion member 15 of the present embodiment is, more specifically, composed of a first adhesion layer 15A and a second adhesion layer 15B installed on the surfaces 18X and 18Y of the sheet-shape connection member 18, respectively.

In the description below, the surface on the side where the top end 13A of the connector 13, whose diameter is small, is arranged is taken as one surface 18X, and the surface on the side where the base end 13B is arranged is taken as the other surface 18Y.

In the present embodiment, the adhesion member 15 (That is, the adhesion layers 15A, 15B) is formed so as to surround the plurality of the conduction parts 11 arrayed in a row, and formed in a frame shape. In FIG. 1, since the sheet-shape connection member 18 is formed in a square shape, the adhesion member 15 (the adhesion layers 15A, 15B) is formed in a square frame shape after the shape of the sheet-shape connection member 18, but the shape is not limited to a square frame shape, and may be any shape.

In the present embodiment, either of the first and second adhesion layers 15A, 15B is a pressure-sensitive adhesive agent layer. When the first and second adhesion layers 15A, 15B are pressure-sensitive adhesive agent layers, the electrical connection sheet 10 can easily be pasted on a mounting member, a terminal and the like. Further, repasting or otherwise can be carried out. Further, the pressure-sensitive adhesive agent layer is usually flexible; therefore, when the layer is pasted on a mounting member, it becomes easy for the layer to be deformed or otherwise after the shape of the mounting member, so that it becomes easy for the electrical connection sheet 10 to be fixed in a high adhesive force to the terminal, the mounting member and the like.

The thickness of each of the first and second adhesion layers 15A, 15B is not especially limited, but is, for example, 10 to 100 μm and preferably 20 to 80 μm.

As a pressure-sensitive adhesive agent constituting the pressure-sensitive adhesive agent layer, a well-known pressure-sensitive adhesive agent can be used, and there can be used, for example, an acrylic pressure-sensitive adhesive agent, a urethane-based pressure-sensitive adhesive agent, a silicone-based pressure-sensitive adhesive agent or a rubbery pressure-sensitive adhesive agent.

The respective thicknesses T1, T2 of the first and second adhesion layers 15A, 15B may be smaller than, or larger than, or equal to respective distances (heights H1, H2) from the connection member 18 to the ends (top end 13A, base end 13B) of the connector 13 (that is, conduction part 11).

Any of intervals S1, S2 . . . Sn between the adhesion member 15 (that is, first and second adhesion layers 15A, 15B) and each of the conduction parts 11 is, for example, 0.1 to 10.0 mm and preferably 0.5 to 5.0 mm. Here, the intervals S1, S2 . . . Sn (n is the number of conduction parts installed in the electrical connection sheet 10) are each the shortest distance between each of the conduction parts 11 and the adhesion member 15. By making any these intervals in the above ranges, it becomes easy for a pressure to urge uniformly each of the conduction parts 11. It is preferable that the intervals S1, S2 . . . Sn are mutually close values. Therefore, in these intervals S1, S2 . . . Sn, the maximum value is preferably 3 or less times, more preferably 2 or less times, still more preferably 1.5 or less times the minimum value.

<Production Method>

Hereinafter, a method for producing the electrical connection sheet 10 of the present embodiment will be described. First, in the present production method, a metal mold is prepared. The metal mold is constituted of an upper mold and a lower mold composed of a nonmagnetic material such as aluminum or copper. In the upper mold and the lower mold, pins composed of a ferromagnetic material such as iron or a magnet are embedded at positions corresponding to the conduction parts 11. One ends of the pins are exposed on the cavity surfaces of the upper mold and the lower mold.

Further, a resin sheet or the like for constituting the connection member 18 is prepared. The resin sheet suffices if a resin sheet having a plurality of through-holes 18A formed by punching out or the like is prepared. The resin sheet is inserted in the above metal mold embedded with the pins, and a liquid rubber, a melted thermoplastic elastomer or the like to become a raw material of the connector 13 is injected in the cavity. The liquid rubber has conductive particles having magnetism previously mixed.

Then, a magnetic field is applied from above and under the metal mold by using a magnet. A parallel magnetic field connecting the pins is formed in the cavity, and the conductive particles in the liquid rubber or the like are continuously arrayed in the magnetic field direction. After the arraying, the upper and lower metal molds are completely closed and a heat treatment is carried out to cure the liquid rubber, whereby a sheet-shape molding is obtained in which the connectors 13 and the resin sheet constituting the connection member 18 are unified. Thereafter, the sheet-shape molding is fitted with the adhesion member by well-known means to thereby obtain the electrical connection sheet.

Second Embodiment

Figure 4:
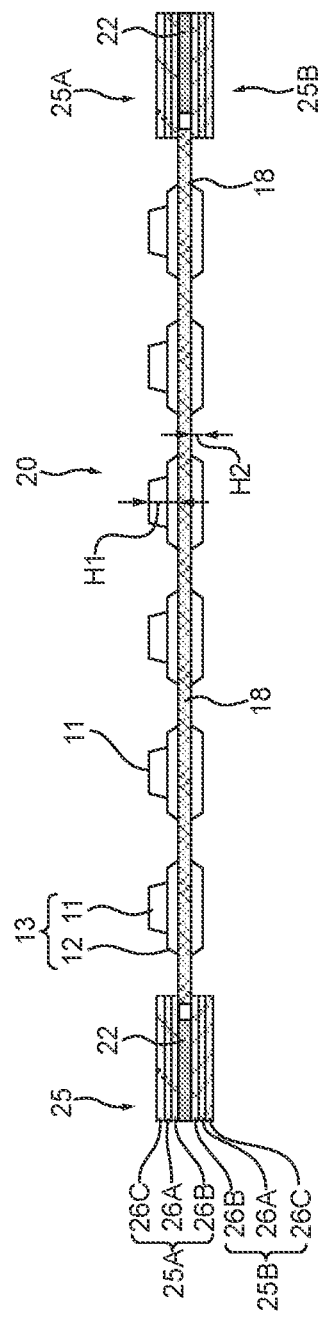
FIG. 4 is a cross-sectional view of an electrical connection sheet according to a second embodiment.

Then, an electrical connection sheet according to a second embodiment will be described. An electrical connection sheet 20 according to the second embodiment is shown in FIG. 4. The electrical connection sheet 20 of the present embodiment is different from the first embodiment in the points of the constitution of the adhesion member and the installation of an outside sheet member. Hereinafter, different points of the second embodiment from the first embodiment will be described.

In the description below, the same reference signs are attached to members having the same constitutions as in the first embodiment, and descriptions thereof will be omitted.

Although the first and second adhesion layers constituting the adhesion member are pressure-sensitive adhesive agent layers in the first embodiment, both of first and second adhesion layers 25A, 25B constituting an adhesion member 25 are a double sided pressure-sensitive adhesive tape in the present embodiment. The each double sided pressure-sensitive adhesive tape has a base material 26A, and pressure-sensitive adhesive agent layers 26B, 26C provided on both surfaces of the base material 26A.

As the base material 26A of the double sided pressure-sensitive adhesive tape, there can be used a well-known one used as base materials of double sided pressure-sensitive adhesive tapes, and for example, a resin film, a nonwoven fabric can be used. As a pressure-sensitive adhesive agent constituting the pressure-sensitive adhesive agent layers 26B, 26C, a well-known pressure-sensitive adhesive agent can be used, and there can be used, for example, an acrylic pressure-sensitive adhesive agent, a urethane-based pressure-sensitive adhesive agent, a silicone-based pressure-sensitive adhesive agent or a rubbery pressure-sensitive adhesive agent.

The thickness of each of the adhesion layers 25A, 25B (that is, each double sided pressure-sensitive adhesive tape) is not especially limited, but is, for example, 0.01 mm or larger and 2 mm or smaller and preferably 0.1 mm or larger and 1.5 mm or smaller.

The respective thicknesses of the adhesion layers 25A, 25B may be smaller than, larger than or equal to the heights H1, H2.

In the present embodiment, the outside sheet member 22 is arranged outside the sheet-shape connection member 18. Then, the double sided pressure-sensitive adhesive tape constituting each of the adhesion layer 25A and 25B is disposed so as to extend across a peripheral portion of the connection member 18 and the outside sheet member 22; and one pressure-sensitive adhesive agent layer 26B of the double sided pressure-sensitive adhesive tape constituting the first adhesion layer 25A is adhered to the peripheral portion of one surface (upper surface in FIG. 4) of the connection member 18 and one surface (upper surface in FIG. 4) of the outside sheet member 22. Thereby, the first adhesion layer 25A (double sided pressure-sensitive adhesive tape) is supported by the peripheral portion of the connection member 18 and additionally also by the outside sheet member 22.

Similarly, the double sided pressure-sensitive adhesive tape constituting the second adhesion layer 25B is adhered to the peripheral portion of the other surface (lower surface in FIG. 4) of the connection member 18 and the other surface (lower surface in FIG. 4) of the outside sheet member 22, and the second adhesion layer 25B (double sided pressure-sensitive adhesive tape) is supported by the peripheral portion of the connection member 18 and additionally also by the outside sheet member 22.

As described above, a sheet-shape molding composed of the connectors 13 and the connection member 18 is obtained by inserting the resin sheet in a metal mold and forming connectors 13 in through-holes 18A of the resin sheet.

The outside sheet member 22 in the present embodiment is composed usually of a resin sheet. As the resin sheet, the same resin sheet as usable for the connection member can be used. The resin sheet of the connection member 18 and the resin sheet of the outside sheet member 22 may be formed of the same material, or different materials, but are formed preferably of the same material. Therefore, it is preferable that when the connection member 18 is a polyimide sheet, the outside sheet member 22 is also the polyimide sheet.

Further the shape of the outside sheet member 22 suffices if having a shape corresponding to a shape of the adhesion member 25 (first and second adhesion layers 25A, 25B). In the present embodiment, since the first and second adhesion layers 25A, 25B are, as in the first embodiment, formed in a frame shape, it is desirable that the outside sheet member 22 also takes a frame shape formed so as to surround the connection member 18.

Also in the second embodiment, as in the first embodiment, by installing a plurality of conduction parts 11, the electric resistance of each of the conduction parts 11 is suppressed low and the temperature rise is thereby suppressed. Further, the electrical connection sheet 20 enables, for example, a terminal to be fixed securely and easily to a mounting member by the adhesion member 25, and makes it difficult for the terminal or the like to peel from the mounting member.

Then, a method for producing the electrical connection sheet 20 of the present embodiment will be described.

In the present producing method, as in the first embodiment, there is obtained a sheet-shape molding in which the connectors 13 and the resin sheet constituting the connection member 18 are unified. Thereafter, the outside sheet member 22 is disposed outside the connection member 18; and the double sided pressure-sensitive adhesive tapes are pasted so as to extend across the connection member 18 and the outside sheet member 22 to thereby obtain the electrical connection sheet 20 of the present embodiment.

In the present embodiment, although the outside sheet member 22 is installed, the outside sheet member 22 may be omitted. In the case where the outside sheet member 22 is omitted, the first and second adhesion layers 25A, 25B constituted of the double sided pressure-sensitive adhesive tape are fitted to the connection member 18 by being pasted only on the peripheral portion of the connection member 18.

Third Embodiment

Figure 5:
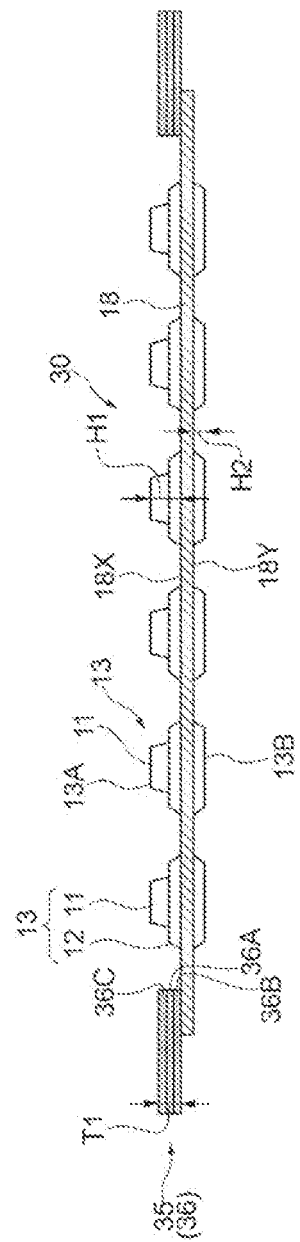
FIG. 5 is a cross-sectional view of an electrical connection sheet according to a third embodiment.

Then, an electrical connection sheet according to a third embodiment will be described. An electrical connection sheet 30 according to the present embodiment is shown in FIG. 5. The electrical connection sheet 30 of the present embodiment has a constitution of an adhesion member different from the constitution of the first embodiment. Hereinafter, there will be described different points of the third embodiment from the first embodiment.

Although in the first embodiment, the adhesion member is constituted of the first and second adhesion layers, an adhesion member 35 of the present embodiment is constituted of one adhesion layer 36, and the adhesion layer is composed of a double sided pressure-sensitive adhesive tape. The double sided pressure-sensitive adhesive tape has, as in the double sided pressure-sensitive adhesive tape of the second embodiment, a base material 36A, and pressure-sensitive adhesive agent layers 36B, 36C provided on both surfaces of the base material 36A.

In the present embodiment, the double sided pressure-sensitive adhesive tape constituting the adhesion layer 36 is disposed so as to protrude from the connection member 18. Then, a part of one pressure-sensitive adhesive agent layer 36A is adhered to the connection member 18, and the remaining part thereof is not adhered to the connection member 18 and disposed and exposed so as to protrude from the connection member 18. Hence, in the present embodiment, by the one pressure-sensitive adhesive agent layer 36B, one surface (lower surface in FIG. 5) side of the electrical connection sheet 30 is enabled to be adhered to another member. Further by the other pressure-sensitive adhesive agent layer 36C, also the other surface (upper surface in FIG. 5) side of the electrical connection sheet 30 is enabled to be adhered to another member.

The adhesion layer 36 is, in the present embodiment, arranged on one surface 18X of the connection member 18. Here, the one surface 18X is the surface on the side where the top ends 13A of the connectors 13 are arranged.

Since the constitutions of each layer (base material and pressure-sensitive adhesive agent layers) of the double sided pressure-sensitive adhesive tape are the same as in the second embodiment, their descriptions are omitted, but the thickness T1 of the adhesion layer 36 is, as described above, for example, 0.1 mm or larger and 2 mm or smaller and preferably 0.1 mm or larger and 1.5 mm or smaller. The thickness T1 of the adhesion layer 36 may be smaller than, larger than or equal to the above-mentioned height H1.

Then, the adhesion layer 36 may be arranged on the other surface 18Y of the connection member 18. In this case, the thickness of the adhesion layer 36 may be smaller than, larger than or equal to the above-mentioned height H2.

Also by the above electrical connection sheet 30 of the third embodiment, as in the first and second embodiments, a terminal can be adhered to a mounting member such as a glass plate. Also in the third embodiment, as in the first and second embodiments, by installing a plurality of the conduction parts 11, the electric resistance of each of the conduction parts 11 is suppressed low, and the temperature rise is thereby suppressed.

Further, since the electrical connection sheet 30 of the present embodiment can be produced only by pasting one sheet of the double sided pressure-sensitive adhesive tape on the sheet-shape molding in which the connectors 13 and the connection member 18 are unified, the production method becomes simpler.

Fourth Embodiment

Figure 6:
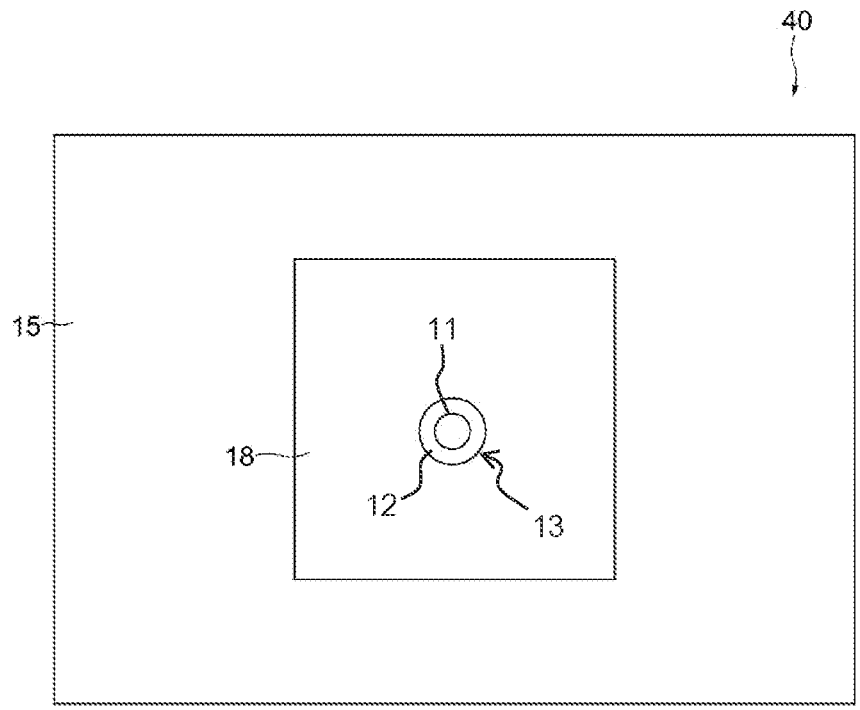
FIG. 6 is a plan view of an electrical connection sheet according to a fourth embodiment.

Then, an electrical connection sheet according to a fourth embodiment will be described. An electrical connection sheet 40 according to the present embodiment is shown in FIG. 6. The electrical connection sheet 40 of the present embodiment is different from the first embodiment in the constitution of the conduction part. Hereinafter, the different points of the fourth embodiment from the first embodiment will be described.

Although in the first embodiment, the constitution is such that the conduction part 11 is installed in plural numbers, in the present embodiment, the constitution is such that the conduction part 11 is installed singly. In the present embodiment, the conduction part 11 can be utilized in the single number due to that the conduction part 11 has a low hardness and a sufficiently low electric resistance. Here, "low hardness" refers to that the hardness of the rubbery elastomer after curing constituting the conduction part 11 is A50 or lower in the type A durometer hardness according to JIS K6253; and the hardness is preferably A5 to A50, more preferably A10 to A40 and still more preferably A15 to A30. Then, "sufficiently low electric resistance" refers to that the electric resistance when compressed by 20% is 50 mΩ or lower; and the electric resistance is preferably 20 mΩ or lower and more preferably 10 mΩ or lower.

The conduction part 11 is constituted preferably of a conductive rubbery elastomer in which a large number of conductive particles are contained in a rubbery elastomer.

The conductive particle is preferably a magnetic conductive particle. The material of the magnetic conductive particle includes nickel, cobalt, iron, ferrites, and alloys thereof; and the shape thereof includes particulate shapes, fibrous shapes, chip shapes and fine wire shapes. The magnetic conductive particle may further be a highly conductive metal, a resin or a ceramic coated with a magnetic conductor or a magnetic conductor coated with a highly conductive metal. The highly conductive metal includes gold, silver, platinum, aluminum, copper, iron, palladium, chromium and stainless steels.

For example, in the case of a silver-coated nickel particle, when the amount of the highly conductive metal coating the magnetic conductor in the case where the conduction part 11 is in the single number is in the range of 5 to 40% by mass in mass ratio of silver to nickel, the magnetism of the conductive particle becomes high and the electric resistance becomes sufficiently low, which is preferable. The kinds and amounts of a magnetic conductor and a metal contained in the conductive particle can be analyzed, for example, by ICP atomic emission spectrometry. From these viewpoints, in the case of the silver-coated nickel particle, the ratio of the mass of silver to that of nickel is preferably 10 to 35% by mass and more preferably 20 to 30% by mass.

The filling factor of the conductive particles in the case where the conduction part 11 is in the single number is, for example, 20 to 80% by volume and preferably 30 to 60% by volume. By making the filling factor in these ranges, the conductivity can be secured while a certain strength is imparted to the conduction part 11. Here, the filling factor means a volumetric proportion of the conductive particles to the total volume of the conduction part 11.

The diameter in the case where the conduction part 11 in the present embodiment is in the single number is, for example, 1.0 mm or larger and 10.0 mm or smaller. By making the diameter of the conduction part 11 in the above range, a large current is enabled to be made to flow through the single conduction part 11 without making the electric resistance of the conduction part 11 very high. From the viewpoint of making the electric resistance to be sufficiently low and making it more difficult for the temperature to rise even when a large current is made to flow, the diameter is preferably 1.5 mm or larger and 5.0 mm or smaller.

Here, the diameter of the conduction part 11, in the case where the diameter varies along the thickness direction Z, may be calculated as an average value (for example, 10-point average).

The height H in the case where the conduction part 11 in the present embodiment is not especially limited, but is preferably 0.2 mm or higher and 3.0 mm or lower and more preferably 0.5 mm or higher and 1.8 mm or lower.

By making the height H of the conduction part 11 to be equal to or higher than these lower limits, even when the conduction part 11 is electrically connected in a sufficiently compressed state, generation of short-circuit is prevented. Further by making that to be equal to or lower than these upper limits, it becomes unnecessary for the distance between the terminal and the contact member of the conduction layer or the like to be separated more than needed.

In the fourth embodiment, even when the conduction part 11 is in the single number, the electric resistance is suppressed low and the temperature rise is thereby suppressed due to that the conduction part 11 has a low hardness and a sufficiently low electric resistance. Further, the electrical connection sheet 40 enables, for example, a terminal to be fixed securely and easily to a mounting member by the adhesion member 15, and makes it difficult for the terminal or the like to peel from the mounting member.

Modified Examples of Array of Conduction Parts

As above, specific examples of the electrical connection sheet of the present invention have been described by way of the above first to fourth embodiments, but various modifications may be made without departing form the gist of the present invention.

Although in the above first to third embodiments, such a constitution is shown that the connectors 13 (conduction parts 11) are arrayed in one straight row, the array of the connectors 13 (conduction parts 11) is not limited to the forms of the above first to third embodiments.

Figure 7:
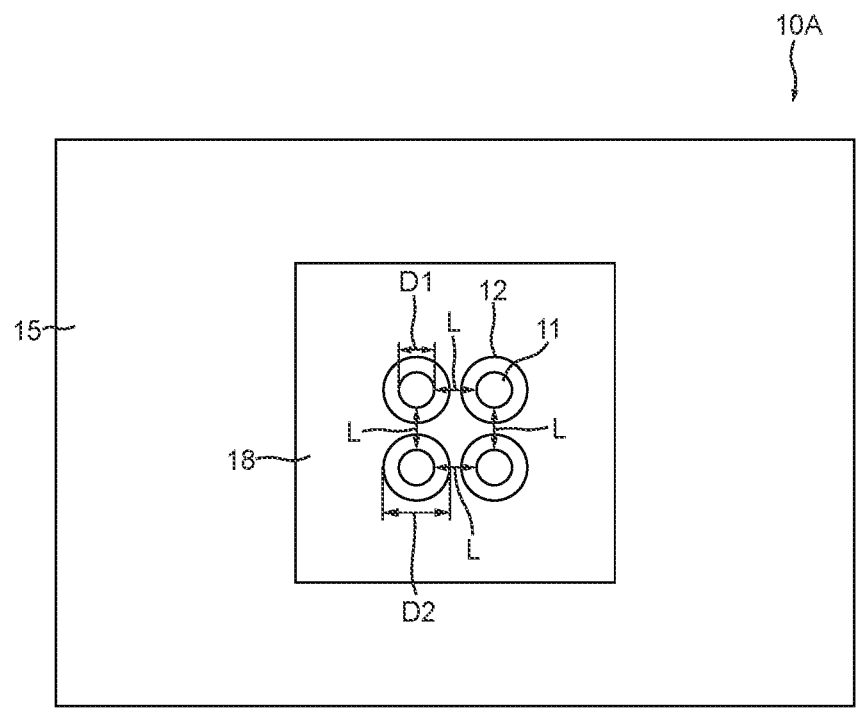
FIG. 7 is a plan view showing a modification of an electrical connection of the present invention.
Figure 8:
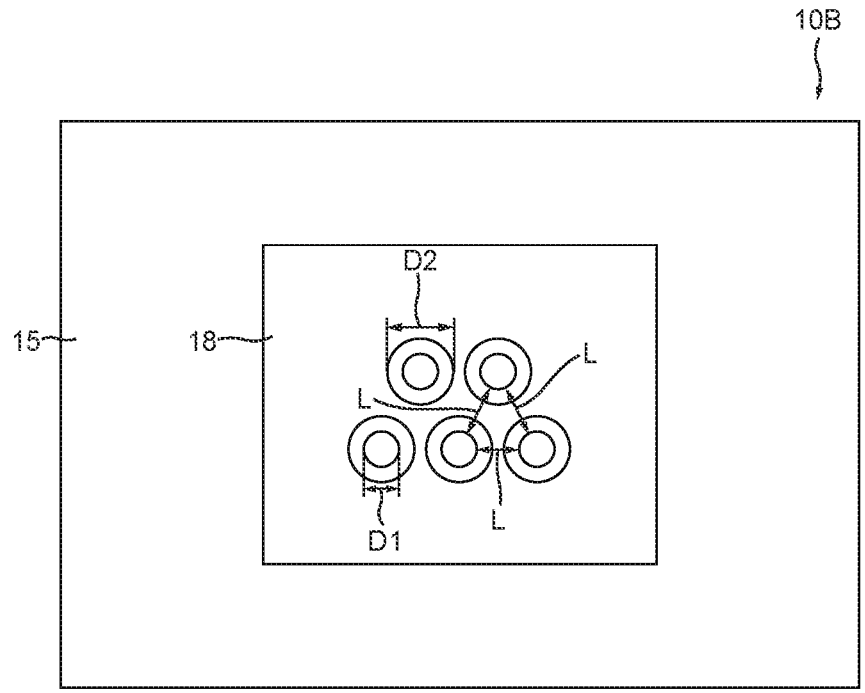
FIG. 8 is a plan view showing a modification of an electrical connection of the present invention.

For example, as in electrical connection sheets 10A, 10B shown in FIGS. 7 and 8, a row in which a plurality of connectors 13 (conduction parts 11) are arrayed in one row in the lateral direction may be arrayed further in plural numbers in the longitudinal direction. In this case, as shown in FIG. 7, the positions of the connectors 13 may be disposed at the same positions in the longitudinal and lateral directions. Further as shown in FIG. 8, each connector 13 on a row may be disposed at a position between a connector and a connector on the adjacent row.

Figure 9:
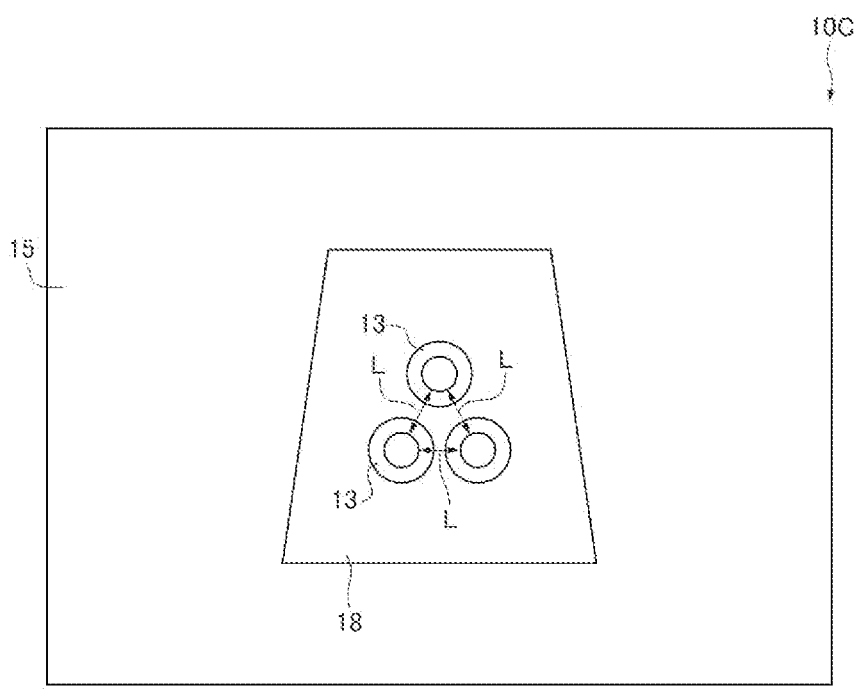
FIG. 9 is a plan view showing a modification of an electrical connection of the present invention.

Further as in an electrical connection sheet 10C shown in FIG. 9, three connectors may be arrayed so as to mutually make the same interval.

Here, in each of the modified examples, the diameter D1 and the height H of the conduction part 11, the diameter D2 and the intervals S1, S2, . . . Sn of the connectors 13 (insulation parts 12) are the same as those in the above first embodiment. The interval L between the conduction parts 11 is also the same as in the first embodiment. In the electrical connection sheets 10A, 10B, 10C shown in FIGS. 7 to 9, however, the plurality of the conduction parts 11 are disposed mutually at the same intervals L (shortest distance), but do not need to be disposed at the same intervals.

Here, the array of the connectors 13 (conduction parts 11) is not limited to the above, and may be any form as long as not being adverse to the object of the present invention.

Further in the present invention, the number of the conduction parts 11 installed in the connection member 18 suffices if being one or more, but is preferably 2 or more and more preferably 3 or more. The upper limit of the number of the conduction parts 11 is not especially limited, but is, from the viewpoint of the productivity and the like, preferably 20 and more preferably 10.

Modified Examples of the Adhesion Member

Although in the above first to third embodiments and modified examples, the adhesion member has a frame shape surrounding the plurality of the conduction parts 11 installed in the connection member 18, the frame shape is not limited as long as being disposed on the outer side than the plurality of the conduction parts 11.

Figure 10:
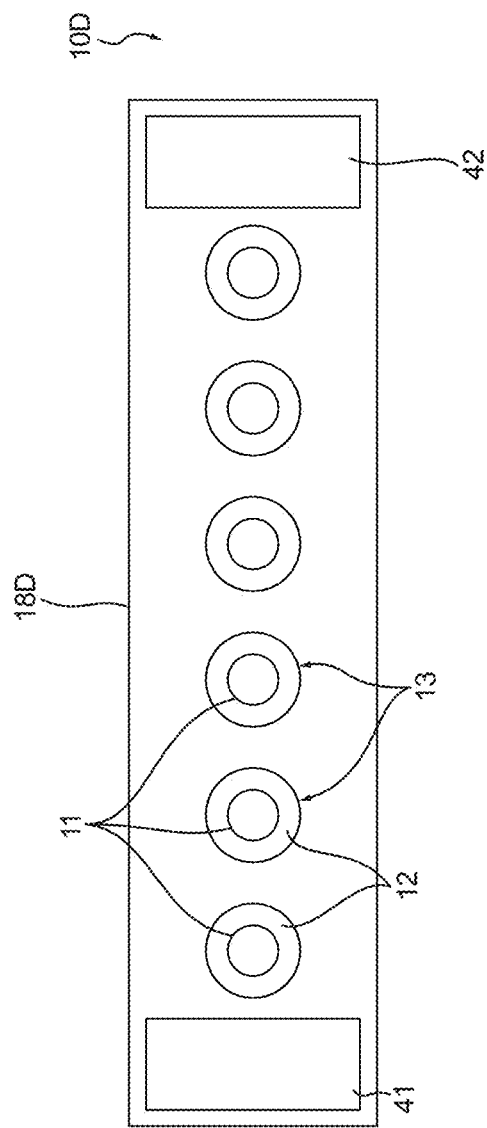
FIG. 10 is a plan view showing a modification of an electrical connection of the present invention.

For example, an adhesion member, as in an electrical connection sheet 10D shown in FIG. 10, may be one composed of a first and second adhesion members 41, 42 disposed so as to sandwich the conduction parts 11 therebetween. Further, an adhesion member, as in an electrical connection sheet 10E shown in FIG. 11, may be one in which a third and fourth adhesion members 43, 44, in addition to a first and second adhesion members 41, 42, are installed so as to surround the plurality of the conduction parts 11 from four sides.

Further, such a constitution may be used that the plurality of the conduction parts are surrounded by five or more adhesion members. Further, such a constitution may be used that the above frame-shape adhesion member (adhesion layer) is provided with narrow vias, grooves or the like connecting the frame interior and the frame exterior, and adhesion by the adhesion member over the whole circumference is not made.

In any of these cases, each of the adhesion members may be, as in the first and second embodiments, composed of a first and second adhesion layers, or may be, as in the third embodiment, composed of one adhesion layer.

Figure 11:
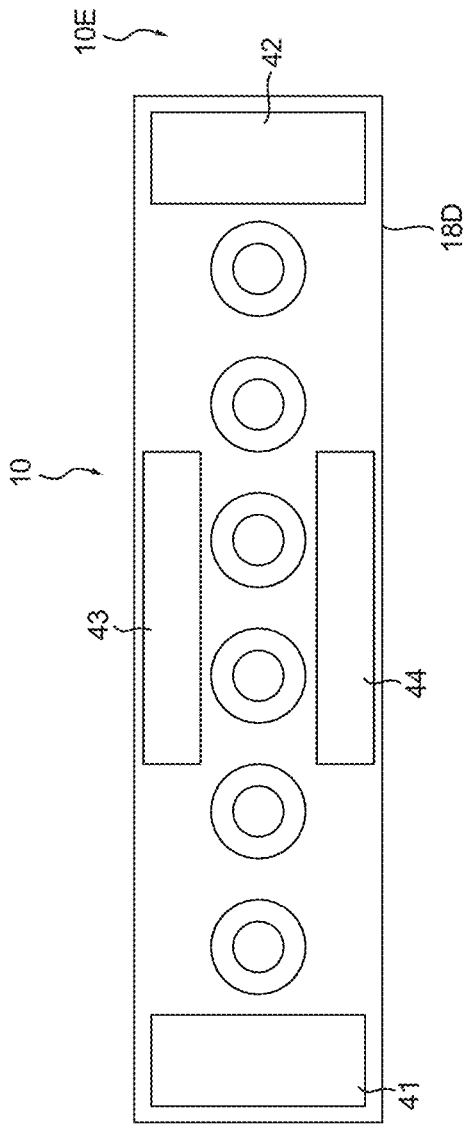
FIG. 11 is a plan view showing a modification of an electrical connection of the present invention.

In the electrical connection sheets 10D, 10E shown in FIGS. 10 and 11, the plurality of the connectors 13 (conduction parts 11) are, as in the first embodiment, arrayed in one row, but may also have other arrays, for example, arrays shown in the above FIGS. 7 to 9, or any other arrays.

Here, the adhesion members being disposed further on the outer side than the plurality of the conduction parts 11 means that at least one adhesion member is provided so as to be in closer proximity to one position of peripheries 18D (see FIGS. 10 and 11) of the connection member 18 than each of the conduction parts 11. Hence, it suffices if at least one adhesion member is disposed between the plurality of the conduction parts 11 and the one position of the peripheries 18D. Therefore, for example, in the electrical connection sheet 10D shown in FIG. 10, the second adhesion member 42 may be omitted.

Figure 12:
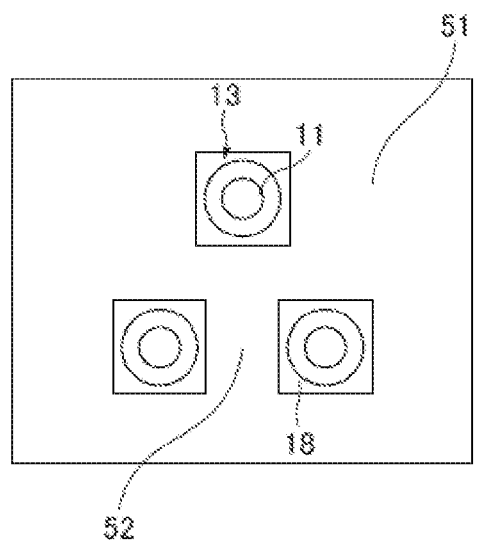
FIG. 12 is a plan view showing a modification of an electrical connection of the present invention.

The adhesion member may be arranged partially between the plurality of the conduction parts 11. For example, as shown in FIG. 12, the adhesion member may be composed of a combination of a frame part 51 surrounding the outside of the plurality of the conduction parts 11 (connectors 13) with a connection part 52 disposed between the conduction parts 11 and connecting inner peripheral portions of the frame part 51.

Although in the above descriptions, there has been shown a form in which the adhesion member is constituted of the pressure-sensitive adhesive agent layer or the double sided pressure-sensitive adhesive tape, the adhesion layer constituting the adhesion member may be in any form as long as being in a form in which each surface of the electrical connection sheet can be adhered to other members. For example, in the first embodiment shown in FIGS. 1, 2, as the first and second adhesion layers 15A, 15B, any adhesive agent other than a pressure-sensitive adhesive agent may be used; for example, the any adhesive agent may be, for example, a hot melt adhesive agent, a thermosetting adhesive agent, a moisture-curing adhesive agent, a light-curing adhesive agent or a combination of these two or more adhesive agents.

Modified Examples of the Connector

Figure 13:
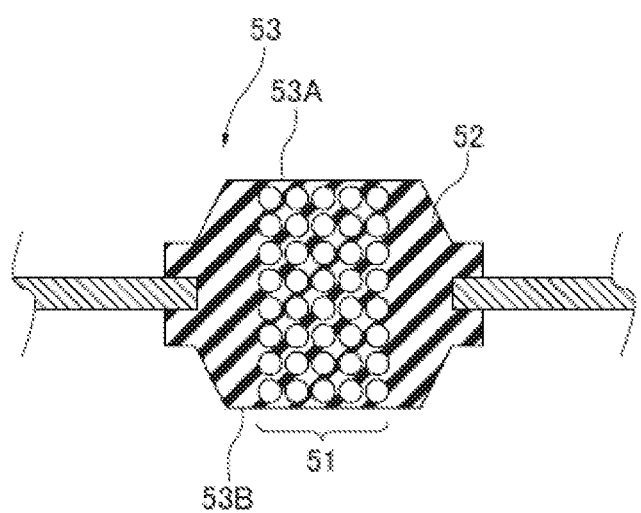
FIG. 13 is a cross-sectional view of a connector of the present invention, having a conduction part.

Also the connector can have various constitutions other than the constitutions described above; for example, as shown in FIG. 13, in a connector 53, the diameters of both ends 53A, 53B are smaller than the diameter of the central portion in the thickness direction. Such a connector 53 enables to contact with both contact members (for example, a conduction layer 73 and a terminal 71 described later) through the ends having a small diameter. The connector 53, as in the above connector, also has a conduction part 51 and an insulation part 52.

[Terminal-Equipped Glass Structure]

The electrical connection sheet of the present invention is used, for example, for electrically connecting a terminal to a conduction layer and fixing the terminal to a glass plate having the conduction layer.

Figure 14:
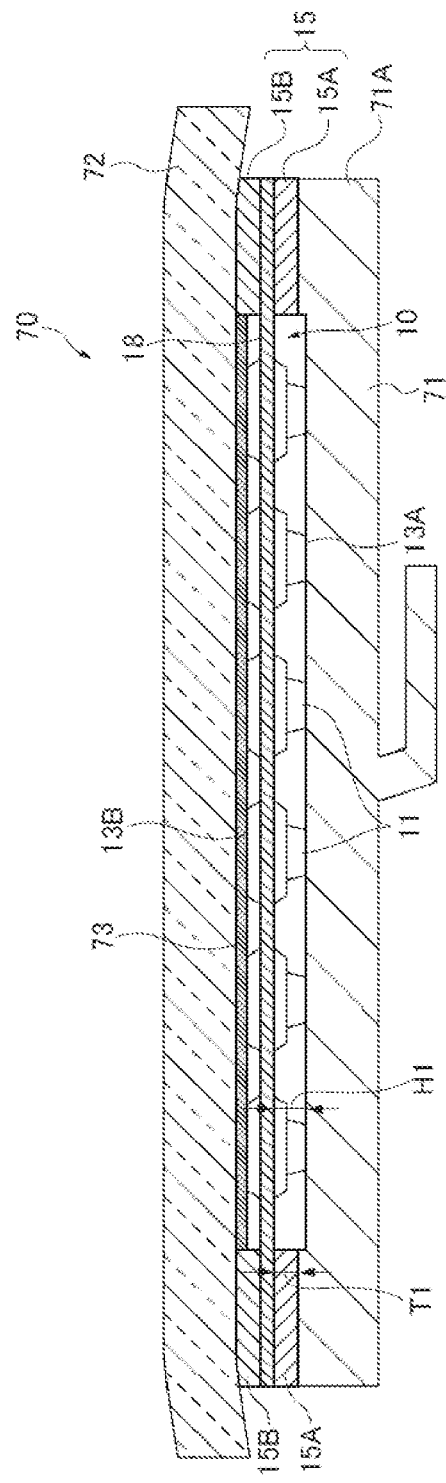
FIG. 14 is a cross-sectional view of a terminal-equipped glass plate structure.

FIG. 14 shows a terminal-equipped glass plate structure 70 in which a terminal 71 is fixed to a glass plate 72 with the electrical connection sheet 10 according to the first embodiment. Hereinafter, the terminal-equipped glass plate structure 70 will be described in more detail.

The terminal-equipped glass plate structure 70 has the electrical connection sheet 10, the glass plate 72 and the terminal 71. The glass plate 72 is provided with a conduction layer 73 on one surface thereof. The terminal 71 is fitted to the surface where the conduction layer 73 of the glass plate 72 is arranged.

The material of the conduction layer 73 is not especially limited, but may be a conductive metal such as gold, silver, platinum, aluminum, copper, iron, palladium, chromium or a stainless steel. Also the material of the terminal 71 is not especially limited, but may be similarly a conductive metal such as gold, silver, platinum, aluminum, copper, iron, palladium, chromium or a stainless steel.

In the terminal-equipped glass plate structure 70, the electrical connection sheet 10 is disposed between the terminal 71 and the conduction layer 73. At this time, both ends (that is, both ends 13A and 13B of the connector 13) of each of the conduction parts 11 of the electrical connection sheet 10 contact with the conduction layer 73 and the terminal 71, respectively. Hence, the terminal 71 is connected to the conduction layer 73 through the plurality of the conduction parts 11.

The electrical connection sheet 10 is adhered through the first adhesion layer 15A to the terminal 71 and through the second adhesion layer 15B to the glass plate 72, thereby fixing the terminal 71 to the glass plate 72. The second adhesion layer 15B may be configured to be adhered to the glass plate 72 and besides, adhered to the conduction layer 73.

Here, each of the conduction parts 11 desirably contacts with the terminal 71 and the conduction layer 73 in a compressed state. Each of the conduction parts 11, since having raised conductivity on being compressed and being urged against the terminal 71 and the conduction layer 73 by its resilience, enables the connection with the terminal 71 and the conduction layer 73 to be more securely made. Although due to the urge by the resilience, the terminal 71 becomes liable to peel off the glass plate 72, in the terminal-equipped glass plate structure 70, since the terminal 71 is securely fixed to the glass plate 72 by the adhesion member 15, the peeling hardly occurs.

Each of the conduction parts 11 is made to be desirably in a state compressed, for example, by 5 to 40%, preferably by 10 to 30%.

The surface of the terminal 71 contacting with the plurality of the conduction parts 11 is desirably in a planar state. Being in a planar state makes it easy for the plurality of the conduction parts 11 to be uniformly compressed.

It is desirable that the connector 13 is made to contact through the base end 13B having a large diameter with the conduction layer 73 and through the top end 13A having a small diameter with the terminal 71. When the terminal is fitted to the glass plate 72, the terminal 71 will be pressed toward the glass plate 72; then, by making the top end 13A having a small diameter to contact with the terminal 71, since the conduction part 11 is easily compressed by the pressing, it becomes easy for the terminal 71 to be fixed to the glass plate 72.

However, such a constitution may be used that the base end 13B is made to contact with the terminal 71 and the top end 13A is made to contact with the conduction layer 73 of the glass plate 72.

Here, in the constitution of FIG. 14, the height H1 from a connection member 18 to the top end 13A of a connector 13 is larger than the thickness T1 of a first adhesion layer 15A. Hence, although an outer peripheral portion 71A of a terminal 71 for adhering to the first adhesion layer 15A becomes higher than the other portion, the outer peripheral portion 71A does not necessarily need to be high, and the surface of the terminal 71 facing a glass plate 72 may be wholly in a planar shape.

The glass plate is not especially limited, but is preferably an automotive glass plate. The automotive glass plate is installed with electric heating wire for a defroster, a defogger or the like in some cases. The glass plate 72 installed with the electric heating wire is usually provided with a conduction layer 73 connected with the electric heating wire collectively. A terminal 71 is connected through conduction parts 11 to the conduction layer 73; hence, a current is made to flow in the electric heating wire through the terminal 71, the conduction parts 11 and the conduction layer 73.

The electric heating wire installed in the automotive glass is high in electric power consumption and needs a large current to be made to flow, but in the electrical connection sheet 10 of the present invention, as described above, since the electric resistance is low, the temperature rise is suppressed even when a large current is made to flow.

Hence, it is preferable to use the electrical connection sheet of the present invention for automotive glass plates, particularly glass plates for rear windows, which are installed with heat-transfer wire for defoggers in many cases.

Here, in the above descriptions of the terminal-equipped glass plate structure, examples using the electrical connection sheet according to the first embodiment have been described, but also in the cases of using other electrical connection sheets, since configurations and procedures are similar, the descriptions will be omitted.

EXAMPLES

Hereinafter, the present invention will be described in more detail by way of Examples, but the present invention is not any more limited to these Examples.

Example 1

An electrical connection sheet was prepared as shown below; a measuring device shown in FIG. 15 was assembled; and the performance of conduction parts was evaluated.

First, a metal mold embedded with ferromagnetic pins was prepared; and a silicone rubber as a liquid rubber blended with silver-coated nickel particles as conductive particles was poured into the metal mold to thereby mold a plurality of connectors. The silver-coated nickel particles used here was ones in which 90% by mass of nickel was coated with 10% by mass of silver. The conductive particles were arrayed in the height direction of the conduction parts. The silicone rubber used was one having a hardness after curing of A30 (measurement value by a type A durometer according to JIS K6253). The filling factor of the conductive particles in the conduction parts was made to be 30% by volume. In the molding of the connectors, a resin sheet being a PET sheet which had through-holes and had a thickness of 0.1 mm was inserted in the metal mold, and the each connector was molded in the inside of the each through-hole of the resin sheet integrally with the resin sheet. The each connector had a structure shown in FIG. 3, in which the resin sheet was embedded in insulation parts of the connectors.

Figure 15:
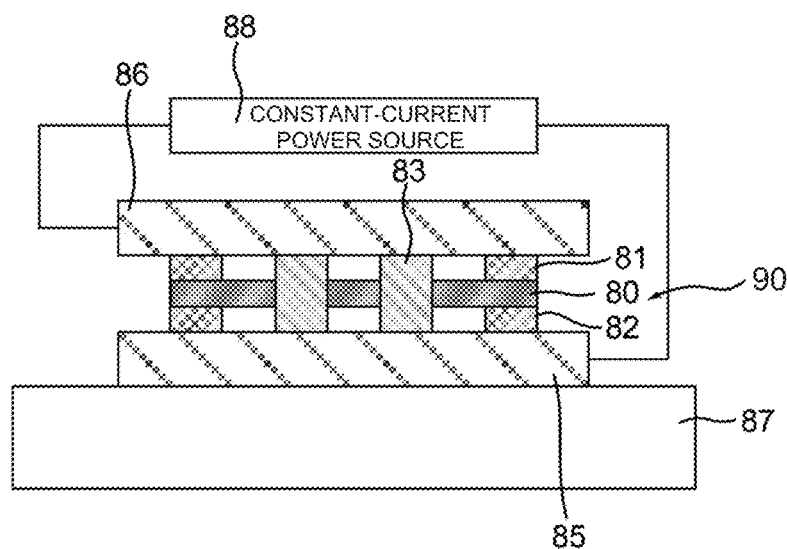
FIG. 15 is a schematic view showing a measuring device to evaluate the performance of conduction parts in Examples.

As shown in FIG. 15, frame-shape double sided pressure-sensitive adhesive tapes 81, 82 surrounding the connectors 83 were pasted on the upper surface and the lower surface of the resin sheet 80 having the connectors molded integrally therewith, respectively, to thereby obtain an electrical connection sheet 90. Here, the each double sided pressure-sensitive adhesive tape 81, 82 had a base material, and pressure-sensitive adhesive agent layers provided on both surfaces of the base material. The thickness of the each double sided pressure-sensitive adhesive tape 81, 82 was 0.2 mm. The interval S1 from the each double sided pressure-sensitive adhesive tape to the conduction parts of the connectors 83 was made to be 20 mm.

In the present Example, the resin sheet 80 was provided with three through-holes and three connectors 83 were formed in the resin sheet 80. The connectors 83 were disposed so as to mutually make equal intervals as in the connectors 13 shown in FIG. 9.

In the connector 83, the height H of the conduction part was 0.66 mm; the diameter D1 thereof was 1.5 mm; the diameter D2 of the connector was 3.5 mm; and the interval L between neighboring conduction parts was 20 mm. The conduction part had an electric resistance in 20% compression of 20 mΩ or lower.

Then, as shown in FIG. 15, the electrical connection sheet 90 was set in the measurement device. Specifically, a first copper electrode 85 was disposed on an insulation member 87; and the electrical connection sheet 90 was disposed thereon. The electrical connection sheet 90 was pasted on the first copper electrode 85 by the double sided pressure-sensitive adhesive tape 82.

A second copper electrode 86 was further disposed on the plurality of the connectors 83 on the electrical connection sheet; and the double sided pressure-sensitive adhesive tape 81 was pasted on the second copper electrode 86. The two copper electrodes 85, 86 were clasped by a jig under the environment of 25° C. and a humidity of 50% RH to compress the conduction parts (that is, connectors 83) by 20% in the thickness direction; and the resultant was left in the compressed state for 1 hour. After the clasping by the jig was released, a current of 26 A was made to flow between the copper electrodes 85, 86 for 30 min by a constant-current power source 88; and the temperature of the conduction parts right thereafter was measured by thermocouples, and the measurement value was taken as a temperature in a first-time measurement.

Then, after the resultant was cooled to 25° C., a current of 26 A was made to flow for 30 min by the same method; and the temperature of the conduction parts right thereafter was measured by thermocouples, and the measurement value was taken as a temperature in a second-time measurement. Thereafter, the same operation was repeated, and the temperature was measured until a fifth-time measurement; and the measurement values are plotted as a graph shown in FIG. 16. Further the results of Example 1 are shown in Table 1.

Example 2

The preparation and the operation were carried out as in Example 1, except for altering the diameter D1 of conduction parts to 1.2 mm and the diameter D2 of connectors to 2.3 mm. The measurement values are plotted as a graph shown in FIG. 16. Further the results of Example 2 are shown in Table 1.

Example 3

The preparation and the operation were carried out as in Example 1, except for altering the number of connectors (that is, conduction parts) to two. The measurement values are plotted as a graph shown in FIG. 16. Further the results of Example 3 are shown in Table 1.

Example 4

The preparation and the operation were carried out as in Example 1, except for altering the number of connectors (that is, conduction parts) to two and the height H of the conduction parts to 0.86 mm. The measurement values are plotted as a graph shown in FIG. 16. Further the results of Example 4 are shown in Table 1.

Example 5

The preparation and the operation were carried out as in Example 1, except for altering the number of connectors (that is, conduction parts) to one, the height H of the conduction part to 2.0 mm, and using the silver-coated nickel particles used as conductive particles in which 70% by mass of nickel was coated with 30% by mass of silver. The measurement values are plotted as a graph shown in FIG. 17. Further the results of Example 5 are shown in Table 2.

Example 6

The preparation and the operation were carried out as in Example 1, except for altering the number of connectors (that is, conduction parts) to two, and using the silicone rubber of the connectors having a hardness of A25. The measurement values are plotted as a graph shown in FIG. 17. Further the results of Example 6 are shown in Table 2.

Example 7

The preparation and the operation were carried out as in Example 1, except for altering the number of connectors (that is, conduction parts) to two, and the content of the conductive particles contained in the conduction parts to 1.66 times, and using the metal mold embedded with no ferromagnetic pins, so that the conductive particles are not arrayed in a chain form in the thickness direction Z. The filling factor of the conductive particles in the conduction parts was made to be 50% by volume. The measurement values are plotted as a graph shown in FIG. 17. Further the results of Example 7 are shown in Table 2.

Example 8

The preparation and the operation were carried out as in Example 1, except for altering the number of connectors (that is, conduction parts) to one. The measurement values are plotted as a graph shown in FIG. 17. Further the results of Example 8 are shown in Table 2.

TABLE 1

|  |  | Unit | Example 1 | Example 2 | Example 3 | Example 4 |
|---|---|---|---|---|---|---|
| Diameter D1 of Conduction Part |  | mm | 1.5 | 1.2 | 1.5 | 1.5 |
| Diameter D2 of Connector |  | mm | 3.5 | 2.3 | 3.5 | 3.5 |
| Height H of Conduction Part |  | mm | 0.66 | 0.66 | 0.66 | 0.86 |
| The Number of Connectors |  | number | 3 | 3 | 2 | 2 |
| Hardness of Rubber |  |  | A30 | A30 | A30 | A30 |
| Mass Ratio of Silver |  | % by mass | 10 | 10 | 10 | 10 |
| Filling Factor |  | % by volume | 30 | 30 | 30 | 30 |
| Interval S1 |  | mm | 20 | 20 | 20 | 20 |
| Alignment of Conductive Particles |  | — | present | present | present | present |
| Temperature of | first time | ° C. | 34 | 35 | 31 | 30 |
| Conduction Part | second time |  | 36 | 34 | 33 | 30 |
| after 30-min | third time |  | 36 | 34 | 33 | 32 |

TABLE 1-continued

|  | Unit | Example 1 | Example 2 | Example 3 | Example 4 |
|---|---|---|---|---|---|
| Energization fourth time |  | 36 | 34 | 33 | 31 |
| fifth time |  | 35 | 35 | 36 | 32 |
| Judgment of Temperature Rise |  | low | low | low | low |

TABLE 2

|  | Unit | Example 5 | Example 6 | Example 7 | Example 8 |
|---|---|---|---|---|---|
| Diameter D1 of Conduction Part | mm | 2 | 1.5 | 1.5 | 1.5 |
| Diameter D2 of Connector | mm | 3.5 | 3.5 | 3.5 | 3.5 |
| Height H of Conduction Part | mm | 0.66 | 0.66 | 0.66 | 0.66 |
| The Number of Connectors | number | 1 | 2 | 2 | 1 |
| Hardness of Rubber |  | A30 | A25 | A30 | A30 |
| Mass Ratio of Silver | % by mass | 30 | 10 | 10 | 10 |
| Filling Factor | % by volume | 30 | 30 | 50 | 30 |
| Interval S1 | mm | 20 | 20 | 20 | 20 |
| Alignment of Conductive Particles | — | present | present | absent | present |
| Temperature of Conduction Part after 30-min Energization first time | °C. | 33 | 34 | 33 | 36 |
| second time |  | 35 | 34 | 34 | 36 |
| third time |  | 35 | 34 | 36 | 39 |
| fourth time |  | 35 | 35 | 36 | 41 |
| fifth time |  | 35 | 35 | 35 | 41 |
| Judgment of Temperature Rise |  | low | low | low | high |

Figure 16:
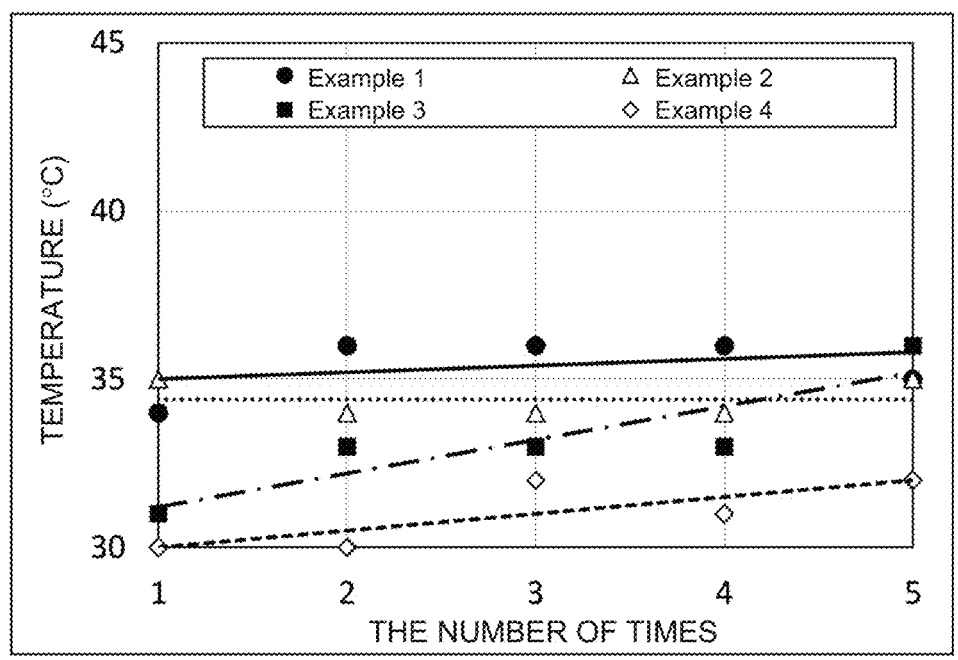
FIG. 16 is graphs
Figure 17:
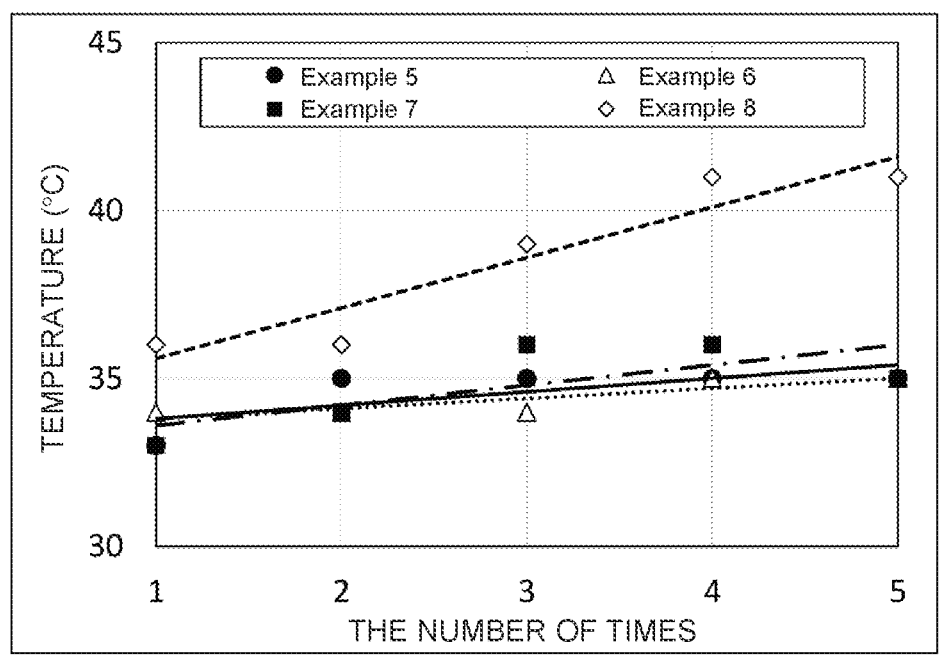
FIG. 17 is graphs

As is clear from the results of FIGS. 16, 17 and Tables 1, 2, in Examples 1 to 4 and 6 and 7, when the conduction part was made to be in plural numbers and a current was made to flow between the copper electrodes, the electric resistance of each of the conduction parts was reduced and the temperature rise was suppressed. In Example 4, thanks to that the close contactability was enhanced by pressure and the electric resistance was reduced due to that the height H of the conduction parts was made large, the equilibrium temperature became low. In Example 5, the number of the connector (that is, conduction part) was made to be one, but by regulating the diameter D1 of the conduction part and the proportion of silver being a highly conductive metal coating the magnetic conductor, similarly, the electric resistance was reduced and the temperature rise was suppressed. In Example 8, in which the number of the connector was made to be one, a slight temperature rise at the conduction part was observed.

REFERENCE SIGNS LIST 10, 10A to 10E, 20, 30, 40 . . . ELECTRICAL CONNECTION SHEET
11 . . . CONDUCTION PART
11B . . . CONDUCTIVE PARTICLE
12 . . . INSULATION PART
13 . . . CONNECTOR
15, 25, 35, 41 to 44 . . . ADHESION MEMBER
15A, 25A . . . FIRST ADHESION LAYER
15B, 25B . . . SECOND ADHESION LAYER
18 . . . CONNECTION MEMBER
18A . . . THROUGH-HOLE
22 . . . OUTSIDE SHEET MEMBER
36 . . . ADHESION LAYER
70 . . . TERMINAL-EQUIPPED GLASS PLATE STRUCTURE
71 . . . TERMINAL
72 . . . GLASS PLATE
73 . . . CONDUCTION LAYER
D1 . . . DIAMETER OF CONDUCTION PART
D2 . . . DIAMETER OF CONNECTOR
H . . . HEIGHT OF CONDUCTION PART
L . . . INTERVAL

The invention claimed is:

1. An electrical connection sheet, comprising:
a conduction part comprising a conductive rubbery elastomer;
an adhesion member; and
a sheet-shaped connection member fitted with the conduction part and the adhesion member,
wherein:
both surfaces of the electrical connection sheet are adhesible;
the adhesion member comprises a first adhesion layer on a first surface of the sheet-shaped connection member and a second adhesion layer on a second surface of the sheet-shaped connection member;
a thickness of the first adhesion layer is smaller than a first distance from the sheet-shaped connection member to a first end of the conduction part which corresponds to the first adhesion layer; and
a thickness of the second adhesion layer is smaller than a second distance from the sheet-shaped connection member to a second end of the conduction part which corresponds to the second adhesion layer.

2. The electrical connection sheet according to claim 1, wherein: the conduction part is one of a plurality of conduction parts;
each of the plurality of conduction parts comprises the conductive rubbery elastomer; and
the sheet-shaped connection member is fitted with the plurality of conduction parts.

3. The electrical connection sheet according to claim 2, wherein the adhesion member is outside the plurality of conduction parts.

4. The electrical connection sheet according to claim 2, wherein an interval between an adjacent two of the plurality of conduction parts is 0.5-200 mm, inclusive.

5. The electrical connection sheet according to claim 1, wherein the conduction part is in a through-hole defined in the sheet-shaped connection member.

6. The electrical connection sheet according to claim 1, wherein each of the first adhesion layer and the second adhesion layer is a pressure-sensitive adhesive agent layer or a double sided pressure-sensitive adhesive tape.

7. The electrical connection sheet according to claim 1, wherein the conductive rubbery elastomer comprises conductive particles.

8. The electrical connection sheet according to claim 7, wherein the conductive particles are continuous in a thickness direction.

9. The electrical connection sheet according to claim 1, wherein the conduction part has a diameter of 1.0-1.5 mm, inclusive.

10. The electrical connection sheet according to claim 1, wherein the conduction part has an electric resistance when compressed by 20% of 100 mΩ or lower.

11. The electrical connection sheet according to claim 1, wherein an interval between the adhesion member and the conduction part is 0.1-10.0 mm, inclusive.

12. A terminal-equipped glass plate structure, comprising:
the electrical connection sheet according to claim 1;
a glass plate with a conduction layer on at least one surface thereof; and
a terminal,
wherein:
the electrical connection sheet is between the terminal and the conduction layer;
the terminal is connected to the conduction layer through the conduction part; and
the terminal is fixed to the glass plate by the adhesion member.

13. The terminal-equipped glass plate structure according to claim 12, wherein the conduction part is compressed.

14. The terminal-equipped glass plate structure according to claim 12, wherein the conduction part is one of a plurality of conduction parts.

* * * * *